United States Patent [19]

Granitz

[11] Patent Number: 5,337,220
[45] Date of Patent: Aug. 9, 1994

[54] ELECTRONIC CARD AND CONNECTOR ASSEMBLY FOR USE THEREWITH

[75] Inventor: Richard F. Granitz, Harrisburg, Pa.

[73] Assignee: The Whitaker Corporation, Wilmington, Del.

[21] Appl. No.: 119,784

[22] Filed: Sep. 10, 1993

[51] Int. Cl.$^5$ .............................................. H05K 9/00
[52] U.S. Cl. .................... 361/816; 174/35 R
[58] Field of Search ............................ 439/607–610; 361/816, 817, 818, 728, 730, 736, 752, 760; 174/35 R, 35 MS

[56] References Cited

U.S. PATENT DOCUMENTS

| | | | |
|---|---|---|---|
| 3,701,071 | 10/1972 | Landman | 339/4 |
| 3,848,952 | 11/1974 | Tighe, Jr. | 339/91 R |
| 4,677,527 | 6/1987 | Pasterchick, Jr. et al. | 361/395 |
| 4,678,252 | 7/1987 | Moore | 439/62 |
| 4,838,806 | 6/1989 | Igarashi | 439/341 |
| 5,031,076 | 7/1991 | Kiku | 361/816 |
| 5,052,942 | 10/1991 | Rauterberg et al. | 439/326 |
| 5,088,929 | 2/1992 | Enomoto | 439/66 |
| 5,154,618 | 10/1992 | Nikoloff et al. | 439/67 |
| 5,186,651 | 2/1993 | Fuchs et al. | 439/495 |
| 5,197,888 | 3/1993 | Brodsky et al. | 439/67 |

FOREIGN PATENT DOCUMENTS 5-17720  5/1993  Japan .

OTHER PUBLICATIONS

PCMCIA Backgrounder (no date provided).

*Primary Examiner*—Leo P. Picard
*Assistant Examiner*—Bot Ledynh
*Attorney, Agent, or Firm*—Driscoll A. Nina, Jr.

[57] ABSTRACT

An electronic card (10) has a housing (12) containing integrated circuitry. On a surface (14) of the card are contact pads (26, 28) connected to the internal circuitry. The contact pads are covered by a movable shield (32). An electrical connector assembly (50) mounted on a printed circuit board (52) includes a base member (56) having contact members (62, 64) in contact with contact pads (54) on the printed circuit board. The connector assembly further includes a hollow casing (66) pivotably mounted on the base member (56). The electronic card (10) is inserted within the casing (66), which is arranged to move the shield (32) so as to expose the contact pads (26, 28) of the card (10). The casing (66) holding the card (10) is then pivoted so that the contact pads (26, 28) of the card (10) engage the contact members (62, 68). A latch member (112) is provided for maintaining the contact pads in engagement with the contact members.

12 Claims, 5 Drawing Sheets

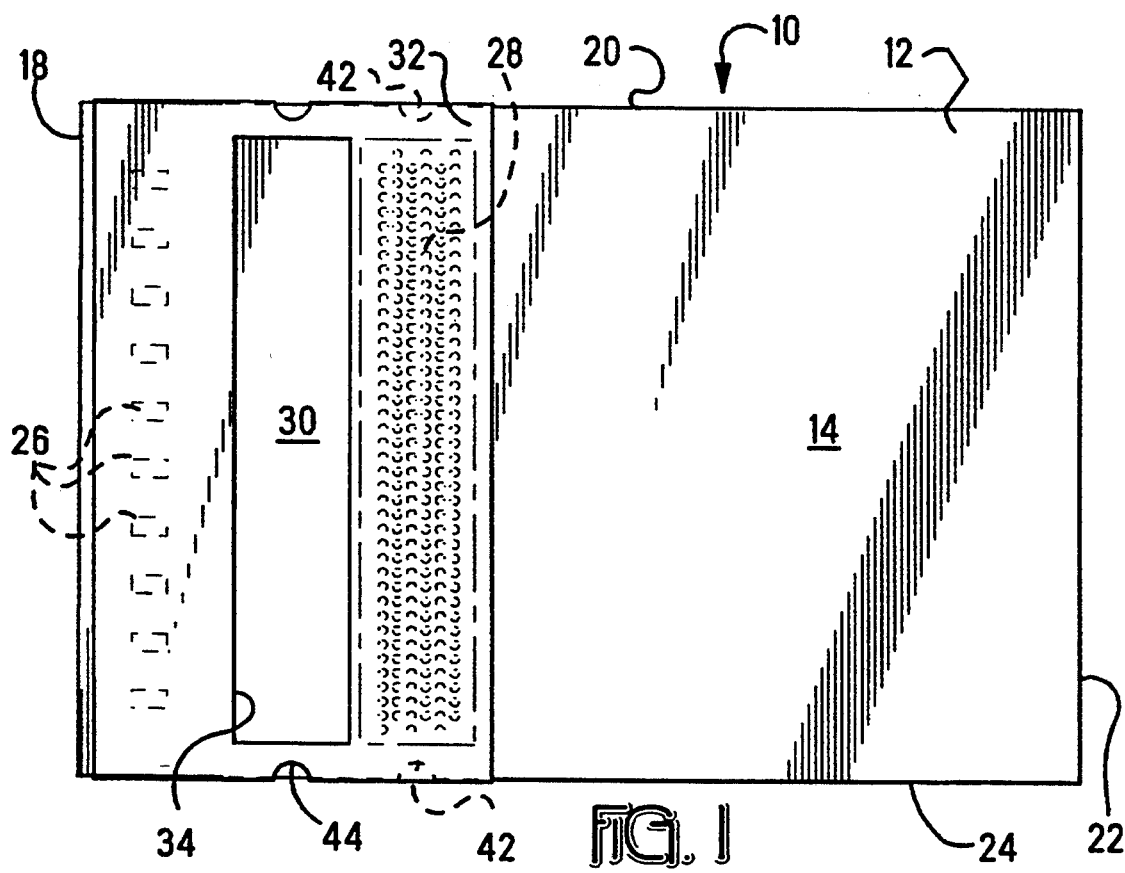
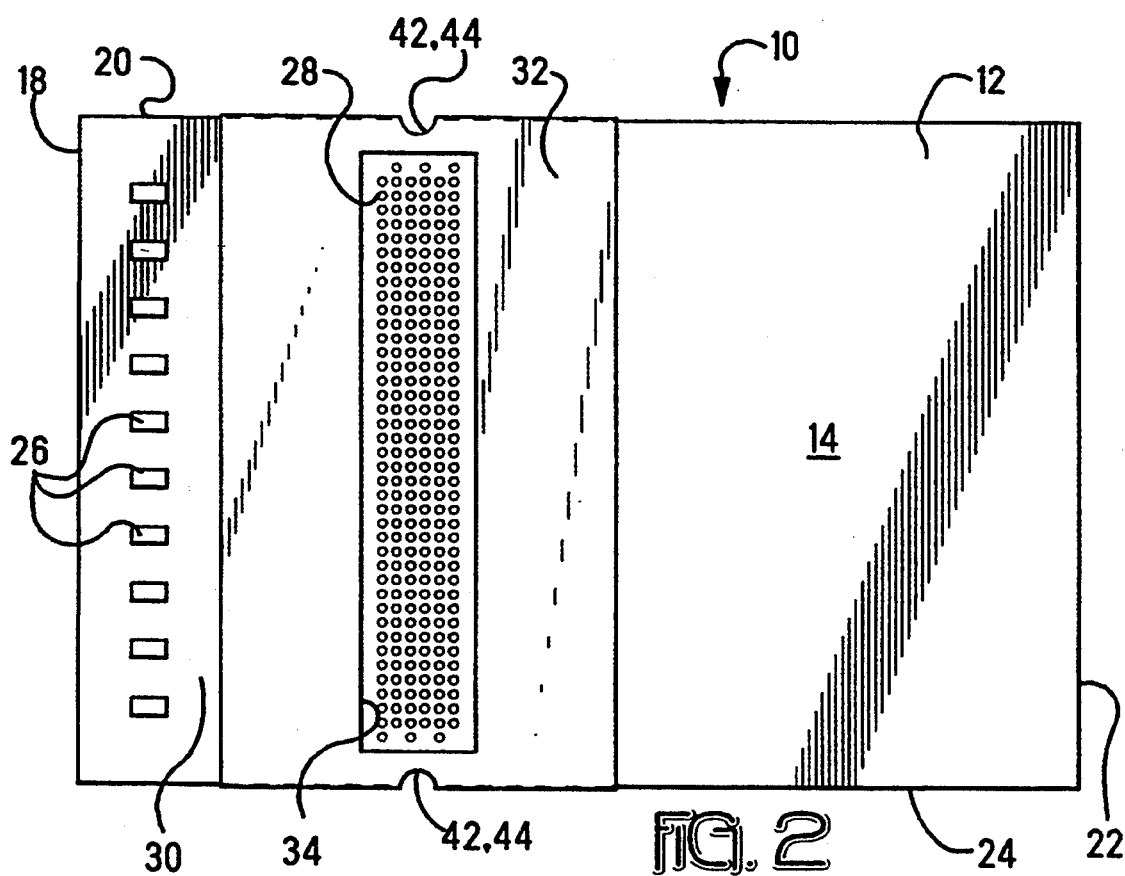

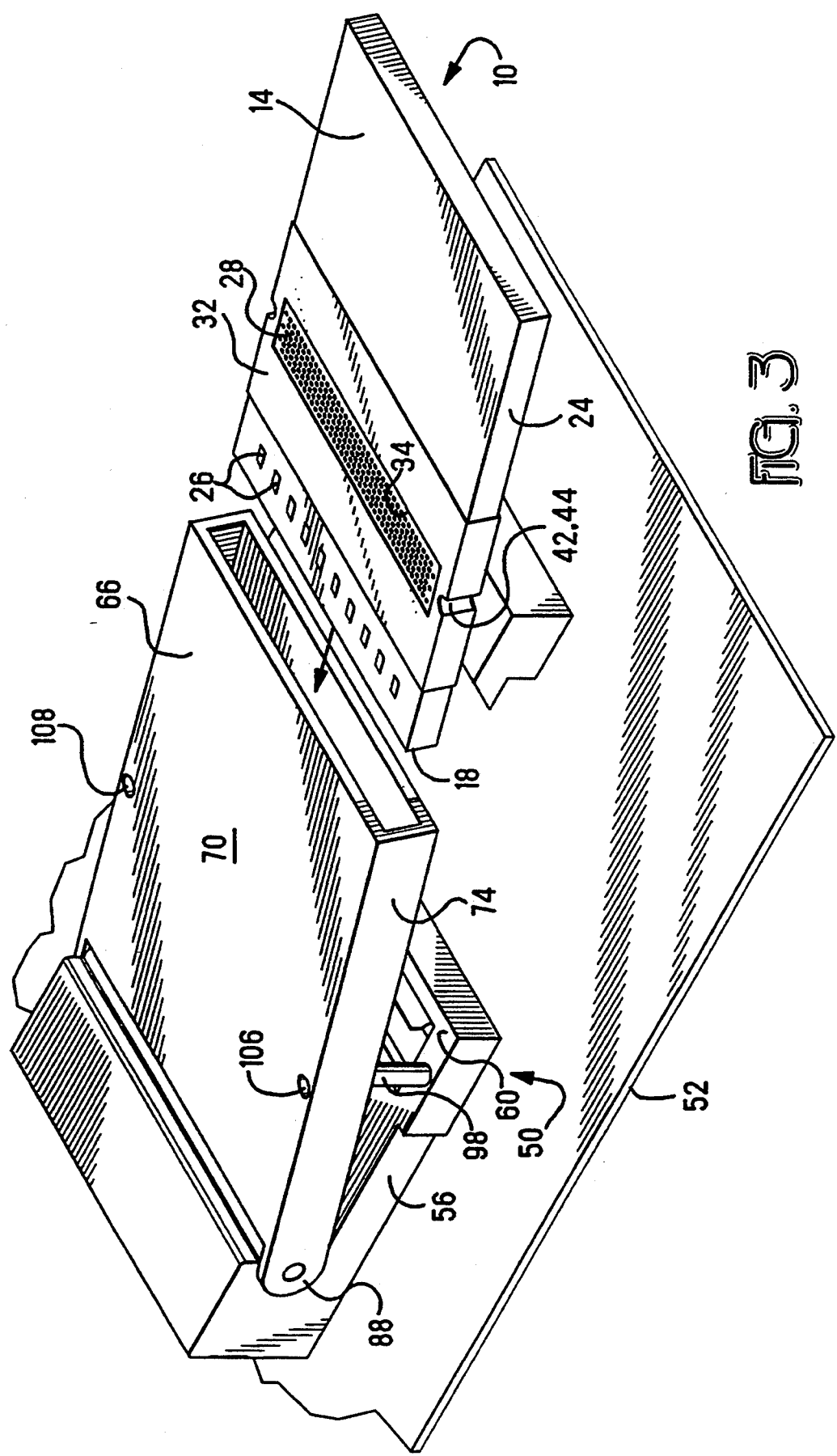

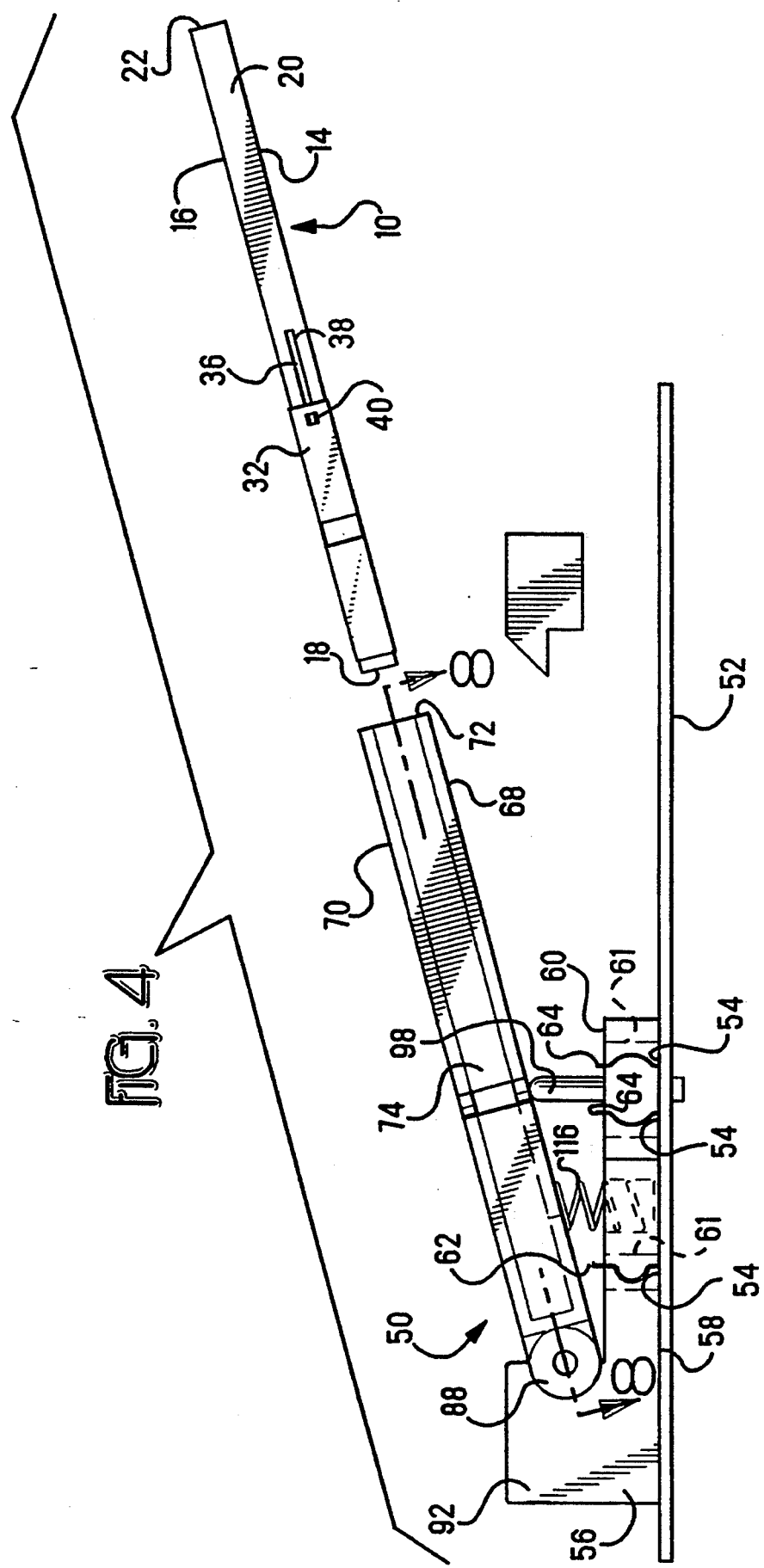

ELECTRONIC CARD AND CONNECTOR ASSEMBLY FOR USE THEREWITH

BACKGROUND OF THE INVENTION

This invention relates to the selective interconnection of a printed circuit board with an electronic card containing integrated circuitry and, more particularly, to an improved design for the electronic card and the connector assembly for use therewith.

Mobile computing devices are becoming more popular. It is contemplated that such devices will have their function determined by specific circuitry easily installed by the user into the device. Thus, if the user wishes to utilize the device as a small portable computer, a first type of circuitry is installed. On the other hand, if the user wishes to utilize the device as a navigational aid compatible with the Global Positioning System, the first type of circuitry will be removed and a second type of circuitry will be installed. To accommodate this emerging technology, the computer industry has focused on a new type of device—the PC card. In order to provide for standardization, industry participants formed the Personal Computer Memory Card International Association (PCMCIA).

Present PC cards offer large data storage and input/output capacity, LAN's, modems and other functions, with low power consumption and fast data access speed in a compact size approximately the length and width of a credit card. The PC cards augment or replace traditional memory, mass storage and input/output devices with removable cards that contain one or more integrated circuits and feature on-card functions or interfaces to external devices. Because they are removable, PC cards let the user expand the memory, storage, communications and other capabilities of a computer without opening the case.

The present PCMCIA PC card standard covers the physical dimensions, pin assignments, electrical specifications, protocols and file formats of the PC card. It specifies a small, removable device approximately the size of a credit card, which can be of three defined thicknesses. The card has sixty eight pin sockets in an array along one of its shorter edges and interfaces with both 8 bit and 16 bit buses.

It has been found that the present card design is not entirely satisfactory. For example, the present 68 pin connection is not adequate for future high performance card functions (32 bit and 64 bit buses, etc.). The present 68 pin connection can support a 32 bit bus architecture only if the signals are multiplexed, thereby increasing overhead time. Increasing the edge rates through the connection will cause signal integrity (noise) problems due to lack of adequate ground reference contacts. Further, the present pin socket arrangement on the cards is subject to contamination/damage caused by debris clogging the card sockets. Thus, if a user carries an assortment of such cards in a briefcase, dust and lint which collects in the briefcase can find its way into the card sockets. Damage to the small and delicate pins in the base unit is also a possibility. The present pin and socket connection approach requires tight centerline spacing and will produce alignment and registration problems if the pin counts are substantially increased beyond the present 68. Also, card insertion/extraction forces will increase proportionately if the pin connection count increases.

It is therefore an object of the present invention to provide a design for an electronic card, and a connector assembly for use therewith, that can support 200 to 300 signal contacts and several power and ground contacts.

It is another object of the present invention to provide such a design wherein the power and ground contacts "make" before the signal contacts connect and "break" after the signal contacts disconnect.

SUMMARY OF THE INVENTION

The foregoing and additional objects are attained in accordance with the principles of this invention by providing an electronic card containing integrated circuitry which comprises a housing containing the circuitry, the housing having first and second generally rectangular major surfaces and four generally rectangular minor edge surfaces joining the first and second major surfaces. A surface array of contact pads electrically connected to the circuitry within the housing is exposed on the first major surface of the housing within a defined area and a shield is mounted to the housing overlying the first major surface. The shield is movable between first and second positions and is arranged so that when it is in the first position the defined area is covered by the shield and when it is in the second position the defined area is exposed.

For electrically connecting such a card to a printed circuit board having a surface array of contact pads, there is provided a connector assembly which includes a base member secured to the printed circuit board, the base member having a first planar surface in contact with the printed circuit board and an opposed second planar surface. A plurality of contact members is disposed in the base member, each of the plurality of contact members being in electrical contact with a respective one of the printed circuit board contact pads and each of the plurality of contact members being exposed at the base member second surface. A hollow casing is provided which has first and second generally rectangular major sides and four generally rectangular minor sides joining the first and second major sides. The interior of the casing is sized so that at least a portion of the electronic card with the defined area of the housing first major surface can be received therein. One of the casing minor edge sides has an opening of sufficient size to receive the electronic card therethrough, and the casing first major side has an opening sized and located so that when the electronic card is disposed within the casing, the defined area of the housing first major surface is registered within the casing first major side opening. Within the casing, there is provided means for moving the electronic card shield from its first position to its second position when the electronic card is inserted in the casing. The casing is mounted to the base member for pivotal movement about a pivot axis so that the casing first major side is movable toward and away from the base member second surface. The mounting of the casing is arranged so that when the casing first major side is pivoted toward the base member second surface and becomes parallel thereto, the casing first major side opening comes into registration with the exposed plurality of contact members. Thus, when the electronic card is inserted in the casing, the shield is moved to expose the card contact pads, and then when the casing is pivoted toward the base member, the plurality of contact members engages the plurality of electronic card contact pads.

In accordance with an aspect of this invention, on the electronic card the plurality of contact pads includes a first group of power and ground pads and a second group of signal pads. The first group of power and ground pads is closer than the second group of signal pads to the casing pivot axis when the electronic card is inserted in the casing. The plurality of contact members includes a first group of power and ground contact members corresponding to the first group of power and ground pads on the electronic card and a second group of signal contact members corresponding to the second group of signal pads of the electronic card, the first group of power and ground contact members being closer than the second group of signal contact members to the casing pivot axis. Thus, when the electronic card is inserted in the casing and is pivoted toward the base member, the first group of power and ground pads of the electronic card engages the first group of power and ground contact members before the second group of signal pads of the electronic card engages the second group of signal contact members. Conversely, when the casing is pivoted away from the base member, the second group of signal pads of the electronic card disengages from the second group of signal contact members before the first group of power and ground pads on the electronic card disengages from the first group of power and ground contact members.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 1 is a plan view of an electronic card constructed according to this invention showing the shield in its first position.

FIG. 2 is a plan view of the electronic card of FIG. 1 with the shield in its second position.

FIG. 3 is a perspective view showing the electronic card and connector assembly according to this invention, with the electronic card shown inverted to expose its operative portion;

FIG. 4 is a side view of the electronic card and connector assembly according to this invention showing the electronic card about to be inserted in the hollow casing;

DETAILED DESCRIPTION

Figure 5:
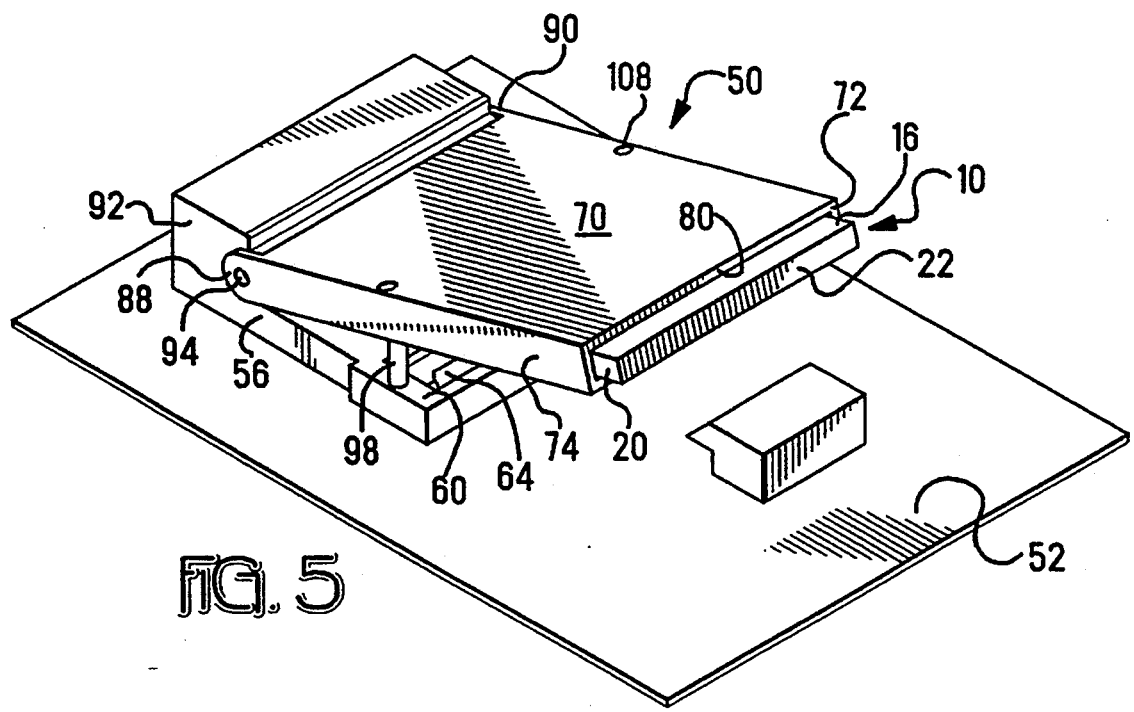
FIG. 5 is a perspective view showing the electronic card inserted in the hollow casing before the casing is pivoted toward the base member.
Figure 6:
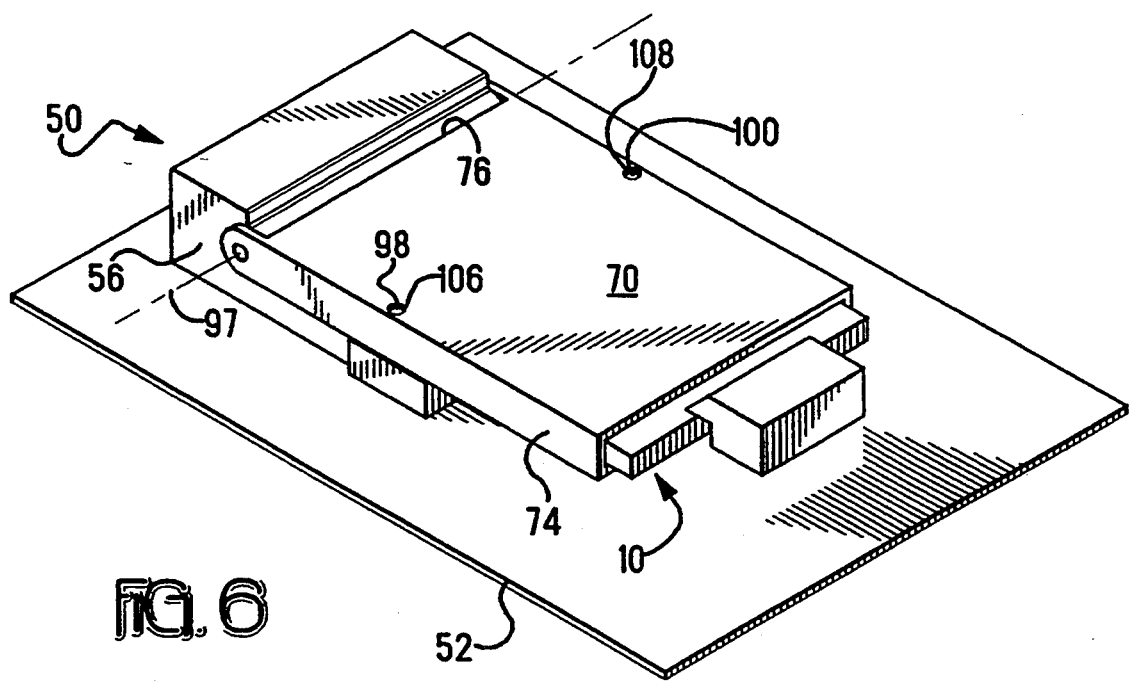
FIG. 6 is a perspective view showing the electronic card inserted in the casing with the casing pivoted toward the base member and latched in position.

Referring now to the drawings, an electronic card constructed according to this invention is designated generally by the reference numeral 10. The card 10 includes a housing 12 which contains integrated circuitry. The housing 12 has a first generally rectangular major surface 14, a second generally rectangular major surface 16 (FIG. 5) and four generally rectangular minor edge surfaces 18, 20, 22, 24 joining the first and second major surfaces 14, 16. The dimensions of the major surfaces 14, 16 are substantially the same as those of a standard credit card.

A plurality of contact pads electrically connected to the circuitry within the housing 12 is exposed on the surface 14 within a defined area. Thus, the contact pads could be directly on the surface 14 or, alternatively, could be on an internal printed wiring board with exposure through an opening in the surface 14. Preferably, the plurality of contact pads includes a first group of power and ground pads 26 and a second group of signal pads 28. The power and ground pads 26 are closer than the signal pads 28 to the edge surface 18 and are separated from the signal pads 28 by a region 30 of the surface 14 having no contact pads thereon. Illustratively, the signal pads 28 form an array of 240 pads arranged as six rows of forty positions in a staggered fifty by fifty mil grid.

The card 10 further includes a shield 32 which is mounted to the housing 12 overlying the surface 14 and movable between first and second positions. The shield 32 is arranged so that when it is in its first position, as shown in FIG. 1, all of the contact pads 26, 28 are covered by the shield 32 and when the shield 32 is in its second position, as shown in FIG. 2, all of the contact pads 26, 28 are exposed. Preferably, the shield 32 is formed with a window 34 of sufficient size and so located on the shield 32 that when the shield 32 is in its first position, the window 34 exposes the region 30 having no contact pads, as shown in FIG. 1, and when the shield 32 is in its second position, the window 34 exposes the signal pads 28 and has moved away from the power and ground pads 26 so that they are likewise exposed, as shown in FIG. 2. Also as shown in FIGS. 1 and 2, when in its first position the shield 32 is closer to the edge surface 18 than when it is in its second position.

The shield 32 may be made of either metal or plastic and is preferably mounted to the housing 12 in a manner similar to the mounting of the shield on a standard 3½ inch floppy disk. Part of this mounting includes a spring member 36 (FIG. 4) disposed in a recess 38 on the minor edge surface 20 of the housing 12. The spring men, her 36 is connected at one end 40 to the shield 32 so as to yieldably bias the shield 32 toward its first position.

For alignment purposes, as will be described in full detail hereinafter, the shield 32 is notched at 42 and the housing 12 is formed with a pair of cavities 44 on its minor edge surfaces 20, 24. As shown in FIG. 1, when the shield 32 is in its first position, the cavities 44 are covered by the shield 32. As shown in FIG. 2, when the shield 32 is in its second position where the contact pads 26, 28 are exposed, the cavities 44 are aligned with the notches 42.

The electronic card 10 which has been described is of no use unless it can be electrically connected to a printed circuit board. FIGS. 3-8 illustrate a connector assembly, designated generally by the reference numeral 50, designed to electrically connect the electronic card 10 with a printed circuit board 52 having a surface array of contact pads 54. The connector assembly 50 includes a base member 56 which has a first planar surface 58 in contact with the printed circuit board 52 and an opposed second planar surface 60. The base member 56 is secured to the printed circuit board 52 in any desired manner, such as by screws or bolts (not shown). Disposed within suitable retention cavities 61 in the base member 56 is a plurality of contact members. The contact members are divided into a first group of power and ground contact members 62 and a second group of signal contact members 64. The power and ground contact members 62 correspond to the power and ground pads 66 on the electronic card 10 and the signal contact members 64 correspond to the signal pads 28 on the electronic card 10. As is conventional, each of the contact members 62, 64 is in electrical contact with a respective one of the printed circuit board pads 54 and is exposed at the base member second surface 60.

The connector assembly 50 also includes a hollow casing 66. The casing 66 has a first generally rectangular major side 68, a second generally rectangular major side 70, and four generally rectangular minor edge sides 72, 74, 76, 78 joining the major sides 68, 70. The interior of the casing 66 is sized so that at least a portion of the electronic card 10 can be accommodated therein. That portion of the electronic card 10 includes the contact pads 26, 28. To enable the electronic card 10 to be inserted into the interior of the casing 66, the minor edge side 72 of the casing 66 is formed with an opening 80 of sufficient size to receive the electronic card 10 therethrough. Further, the major side 68 of the casing 66 has an opening 82 (FIG. 8) sized and located so that when the electronic card 10 is seated within the casing 66, the contact pads 26, 28 are registered within the opening 82.

To move the shield 32 from its first position to its second position against the biasing force of the spring 36 when the electronic card 10 is inserted in the casing 66, the interiors of the minor edge sides 74, 78 of the casing 66 are formed with interference shoulders 84 and 86, respectively. As the electronic card 10 is inserted through the opening 80 and moved inwardly into the interior of the casing 66, the card housing 12 passes by the shoulders 84 and 86, but the shoulders 84 and 86 interfere with the shield 32 so that the shield 32 is moved from its first position to its second position as the card 10 is fully seated within the casing 66.

To effect the interconnection of the contact pads 26, 28 on the electronic card 10 with the contact pads 64 on the printed circuit board 52, the casing 66 is pivotably mounted to the base member 56. Toward this end, the casing 66 is formed with a pair of ears 88, 90 which are extensions of the minor edge sides 74 and 78, respectively, beyond the minor edge side 76. These ears 88, 90 flank an upstanding portion 92 of the base member 56 and are provided with aligned openings 94 and 96, respectively, for accommodating pivot pins therethrough which extend into the upstanding portion 92 to define a pivot axis 97 (FIG. 6) for the casing 66. Thus, when the casing 66 is pivoted so that its major side 68 goes toward the base member surface 60 and becomes parallel thereto, the opening 82 in the side 68 comes into registration with and surrounds the exposed contact members 62 and 64. With the electronic card 10 installed in the casing 66, after such pivoting the electronic card contact pads 26 and 28 engage the contact members 62, 64, respectively.

As disclosed herein, when the electronic card 10 is installed within the casing 66, its power and ground pads 26 are closer than the signal pads 28 to the pivot axis 97 of the casing 66. Likewise, the power and ground contact members 62 are closer than the signal contact members 64 to the pivot axis 97 of the casing 66. Accordingly, the power and ground pads 26 engages the power and ground contact members 62 before the signal pads 26 engage the signal contact members 64 when the casing 66 is pivoted toward the base member 56. Conversely, as the casing 66 is pivoted away from the base member 56, the signal pads 28 disengages from the signal contact members 64 before the power and ground pads 26 disengage from the power and ground contact members 62. Thus, as desired, the power and ground contacts "make" before the signal contacts connect and "break" after the signal contacts disconnect.

Figure 7:
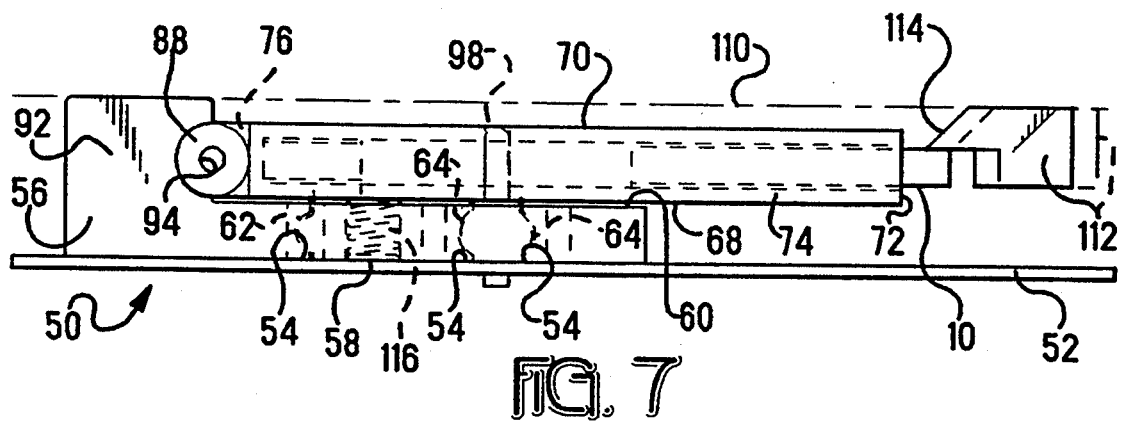
FIG. 7 is a side view of the electronic card and connector assembly in the position shown in FIG. 6.
Figure 8:
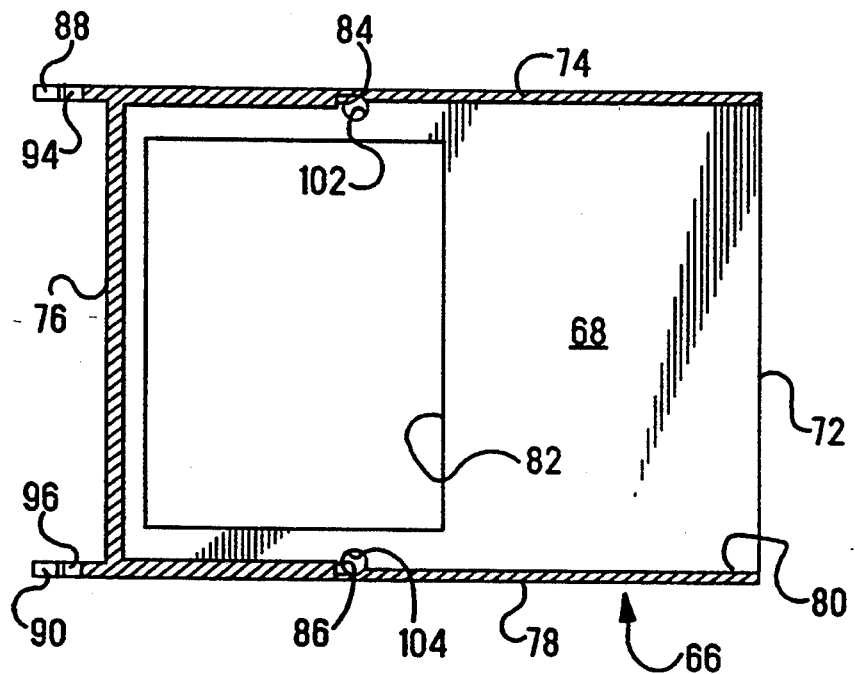
FIG. 8 is a cross sectional view of the casing taken along the lines 8—8 in FIG. 4.

It is necessary to insure that as the casing 66 is pivoted toward the base member 56, the contact pads 26 and 28 are registered with respective ones of the contact members 62 and 64. Accordingly, secured to the base member 56 is a pair of spaced apart projections 98 and 100. These projections 98, 100 extend toward the casing 66. At least the major side 68 of the casing 66 is formed with a pair of openings 102 and 104 sized and spaced to receive the projections 98 and 100, respectively, therethrough as the casing 66 is pivoted toward the base member 56. As illustrated, the major side 70 of the casing 66 is also formed with a pair of openings 106 and 108 aligned with the openings 102 and 104, respectively, to also accept the projections 98, 100, respectively, therethrough. The openings 102, 104, 106 and 108 are aligned with the notches 42 and cavities 44 of the electronic card 10 when the electronic card 10 is fully seated within the interior of the casing 66. Thus, with the electronic card ! 0 so seated, when the casing 66 is pivoted toward the base member 56, the projections 98, 100 extend through the openings 102, 104, through the notches and cavities 42, 44 and through the openings 106, 108 to properly register the pads 26, 28 of the electronic card 10 with the contact members 62, 64. As shown in FIG. 7, the top of the upstanding portion 92 of the base member 56 is preferably aligned with the outer surface 110 of the equipment in which the electronic card 10 is to be installed. Mounted to such equipment, by means not shown, is a latch member 112. The latch 112 is resiliently biased toward the position shown in solid lines but is movable toward the position shown in broken lines. There is also preferably provided a resilient biasing means (spring) 116 (FIG. 4) for biasing the casing 66 counterclockwise about its pivot axis 97, as viewed in FIG. 7, so that it extends beyond the outer surface 110 of the equipment. This is similar to the arrangement in many present day audio cassette players. Thus, with the casing 66 so biased, the opening 82 on the minor edge side 72, which is remote from the pivot axis 97 of the casing 66, is exposed so that the electronic card 10 may be inserted into the casing 66. The casing 66 may then be pivoted clockwise against the force of the spring 116 until the outwardly extending end of the electronic card 10 engages the ramped surface 114 of the latch member 112. Continued pivoting of the casing 66 causes the latch member 112 to be moved toward the position shown in broken lines so that the electronic card 10 can pass thereby. The latch member 112 then returns to the position shown by the solid lines and retains the electronic card 10 and the casing 66 in their horizontal positions, as viewed in FIG. 7, with the pads 26, 28 engaged with the contact members 62, 64. When it is desired to remove the electronic card 10, the operator moves the latch member 112 toward the position shown in broken lines and the casing 66 "pops up" due to the action of the spring 116, thereby exposing the electronic card 10 for removal.

Accordingly, there has been disclosed an improved design for an electronic card and a connector assembly for use therewith. While an illustrative embodiment of the present invention has been disclosed herein, it is understood that various modifications and adaptations to the disclosed embodiment will be apparent to those of ordinary skill in the art and it is intended that this invention only be limited by the scope of the appended claims.

I claim:

1. An electronic card (10) containing integrated circuitry, comprising:
    a housing (12) containing said circuitry, said housing having first (14) and second (16) generally rectangular major surfaces and four (18, 20, 22, 24) generally rectangular minor edge surfaces joining said first and second major surfaces;
    a plurality of contact pads (26, 28) electrically connected to said circuitry and exposed on said first major surface of said housing within a defined area having a surface area; and
    a shield (32) movable mounted to said housing overlying said first major surface wherein said shield is movable between first and second positions, said shield being arranged so that when said shield is in said first position said defined area is covered by said shield and when said shield is in said second position said defined area is exposed.

2. The card according to claim 1 wherein said shield is formed with a window (34) having a size at least as large as said surface area of said defined area and so located on said shield that when said shield is in said first position said defined area is covered by said shield and when said shield is in said second position said defined area is exposed through said shield window.

3. The card according to claim 1 wherein:
    said plurality of contact pads includes a first group of power and ground pads (26) and a second group of signal pads (28), said first group of power and ground pads (26) being closer than said second group of signal pads (28) to a first (18) of said edge surfaces; and
    said shield first position is closer than said shield second position to said first edge surface, and said shield is formed with a window (34) having a size area at least as large as said surface area of said defined area and so located on said shield that when said shield is in said second position said second group of signal pads (28) is exposed through said shield window.

4. The card according to claim 3 wherein said first and second groups of pads (26, 28) are separated from each other by a region (30) of said first major surface (14) having no contact pads, said region being exposed through said shield window (34) when said shield is in said first position.

5. The card according to claim 1 further including means (36) for yieldably biasing sad shield toward said first position.

6. A connector assembly (50) for electrically connecting a printed circuit board (52) having a surface array of contact pads (54) with an electronic card (10), said electronic card containing integrated circuitry and having a housing (12) containing said circuitry, said housing having first (14) and second (16) generally rectangular major surfaces and four (18, 20, 22, 24) generally rectangular edge surfaces joining said first and second major surfaces, a plurality of contact pads (26, 28) electrically connected to said circuitry and exposed on said first major surface (14) of said housing (12) within a defined area, and a shield (32) mounted to said housing overlying said first major surface and movable between first and second positions, said shield being arranged so that when said shield is in said first position said defined area is covered by said shield and when said shield is in said second position said defined area is exposed, the assembly comprising:
    a base member (56) secured to said printed circuit board (52), said base member having a first planar surface (58) in contact with said printed circuit board and an opposed second planar surface (60);
    a plurality of contact members (62, 64) disposed in said base member, each of said plurality of contact members being in electrical contact with a respective one of said printed circuit board contact pads and each of said plurality of contact members being exposed at said base member second surface;
    a hollow casing (66), said casing having first (68) and second (70) generally rectangular major sides and four (72, 74, 76, 78) generally rectangular minor edge sides joining said first and second major sides, the interior of said casing being sized so that at least a portion of said electronic card with said defined area of said housing first major surface can be accommodated therein, one (72) of said casing minor edge sides having an opening (80) at least as large as one of the edge surfaces of the electronic card (10), and said casing first major side (68) having an opening (82) sized and located so that when said electronic card (10) is disposed within said casing said defined area of said housing first major surface (14) is registered within said casing first major side opening (82);
    means (84, 86) in said casing (66) for moving said electronic card shield (32) from said first position to said second position when said electronic card (10) is inserted in said casing; and
    means (88, 90, 84, 96) for mounting said casing (66) to said base member (56) for pivotal movement about a pivot axis so that said casing first major side (68) is movable toward and away from said base member second surface (60), said mounting means being arranged so that when casing first major side is pivoted toward said base member second surface and becomes parallel thereto said casing first major side opening (82) comes into registration with the exposed plurality of contact members (62, 64);
    whereby when said electronic card is inserted in said casing and said casing is pivoted toward said base member, said plurality of electronic card contact pads (26, 28) engage said plurality of contact members (62, 64).

7. The assembly according to claim 6 wherein on said electronic card (10) said plurality of contact pads includes a first group of power and ground pads (26) and a second group of signal pads (28), said first group of power and ground pads being closer than said second group of signal pads to a first of said edge surfaces (18), said first of said edge surfaces being proximate said pivot axis when said electronic card is inserted in said casing, and wherein said plurality of contact members includes a first group of power and ground contact members (62) corresponding to the first group of power and ground pads (26) of said electronic card and a second group of signal contact members (64) corresponding to the second group of signal pads (28) of said electronic card, said first group of power and ground contact members being closer than said second group of signal contact members to said pivot axis;
    whereby when said electronic card is inserted in said casing and said casing is pivoted toward said base member, said first group of power and ground pads of said electronic card engages said first group of power and ground contact members before said second group of signal pads of said electronic card engages said second group of signal contact members, and when said casing is pivoted away from said base member, said second group of signal pads of said electronic card disengages from said second group of signal contact members before said first group of power and ground pads of said electronic card disengages from said first group of power and ground contact members.

8. The assembly according to claim 6 further including means (98, 100, 42, 44, 102, 104, 106, 108) for registering said plurality of electronic card contact pads (26, 28) with respective ones of said plurality of contact members (62, 64) as said casing containing said electronic card is pivoted toward said base member.

9. The assembly according to claim 8 wherein said casing first major side (68) is formed with a pair of spaced openings (102, 104), said electronic card (10) is formed with a pair of cavities (44) which are aligned with said casing first major side spaced openings when said electronic card is inserted to a predetermined position within said casing, and said apparatus further includes a pair of projections (98, 100) secured to said base member (56) and adapted to each extend through a respective one of said casing first major side spaced openings and into a respective one of said electronic card cavities to effect the registration of said contact pads (26, 28) with said contact members (62, 64).

10. The assembly according to claim 6 wherein said pivot axis is remote from and parallel to said one of said casing minor edge sides (72).

11. The assembly according to claim 6 further including latching means (112) for releasably retaining said electronic card contact pads (26, 28) in engagement with said contact members (62, 64).

12. The assembly according to claim 11 further including means (116) for resiliently biasing said casing (66) away from said base member second surface (60).

* * * * *